(12) United States Patent
Liang et al.

(10) Patent No.: US 8,937,006 B2
(45) Date of Patent: Jan. 20, 2015

(54) METHOD OF SEMICONDUCTOR INTEGRATED CIRCUIT FABRICATION

(75) Inventors: Minchang Liang, Zhu-Dong (TW); Chie-Iuan Lin, Zhubei (TW); Yao-Kwang Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 346 days.

(21) Appl. No.: 13/561,263

(22) Filed: Jul. 30, 2012

(65) Prior Publication Data

US 2014/0030880 A1    Jan. 30, 2014

(51) Int. Cl.
*H01L 21/3205* (2006.01)

(52) U.S. Cl.
USPC .... 438/586; 438/197; 257/369; 257/E29.126; 257/E21.632

(58) Field of Classification Search
USPC ............... 438/197, 586; 257/369, E21.632, 257/E29.126
See application file for complete search history.

(56) References Cited

U.S. PATENT DOCUMENTS

| 8,426,300 B2 * | 4/2013 | Ramachandran et al. .... 438/586 |
| 2011/0156107 A1 | 6/2011 | Bohr et al. |

\* cited by examiner

*Primary Examiner* — David Vu
(74) *Attorney, Agent, or Firm* — Haynes and Boone, LLP

(57) ABSTRACT

A method of fabricating a semiconductor integrated circuit (IC) is disclosed. The method includes receiving a semiconductor device. The method also includes forming a step-forming-hard-mask (SFHM) on the MG stack in a predetermined area on the semiconductor substrate, performing MG recessing, depositing a MG hard mask over the semiconductor substrate and recessing the MG hard mask to fully remove the MG hard mask from the MG stack in the predetermined area.

20 Claims, 9 Drawing Sheets

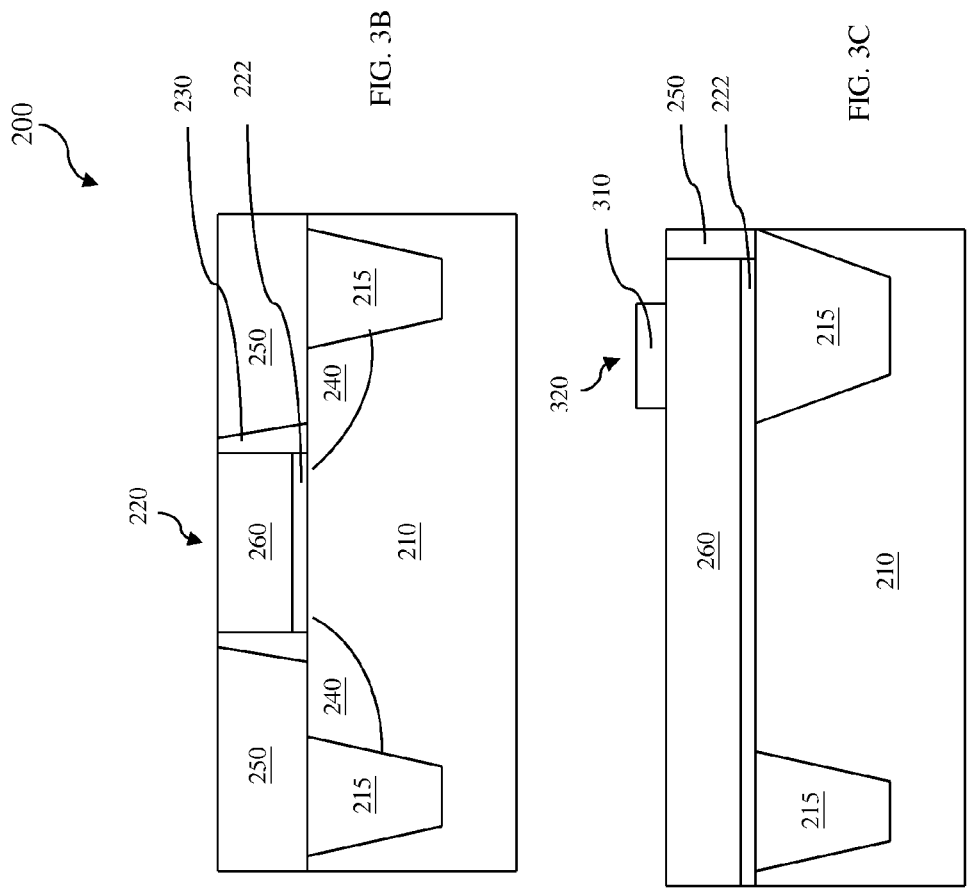
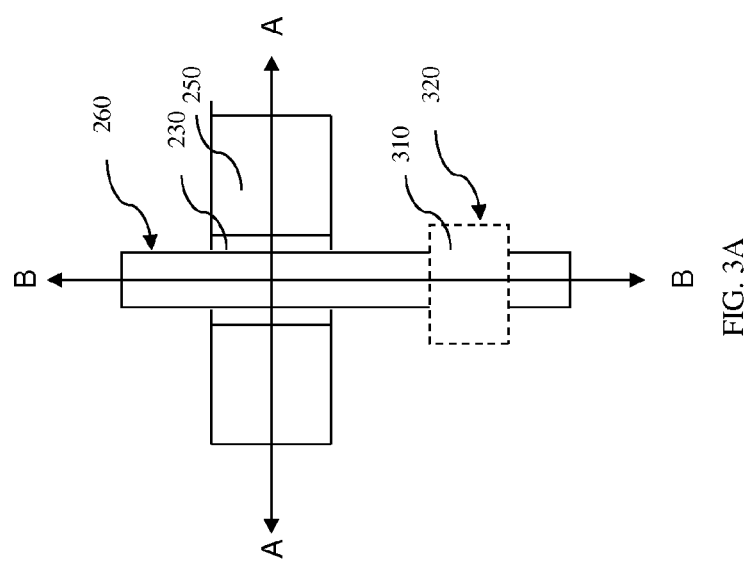

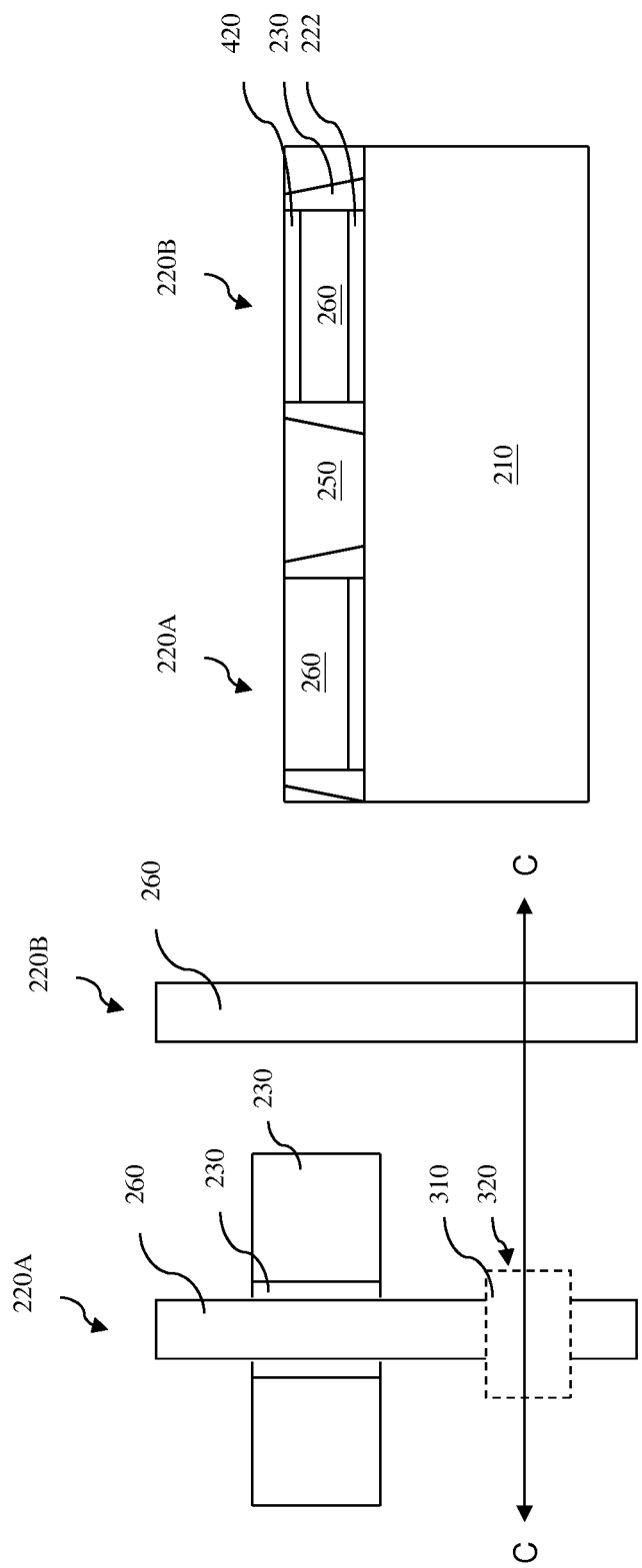

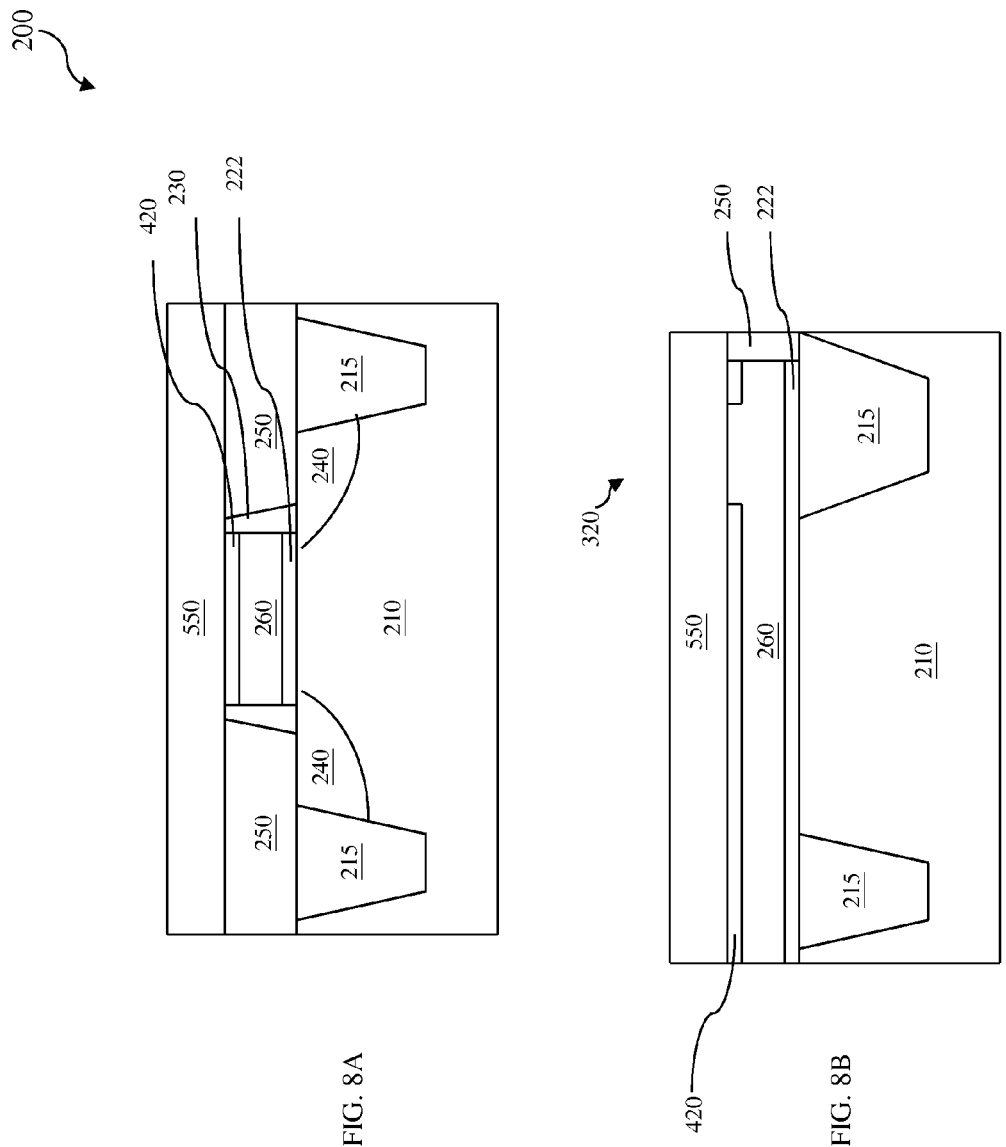

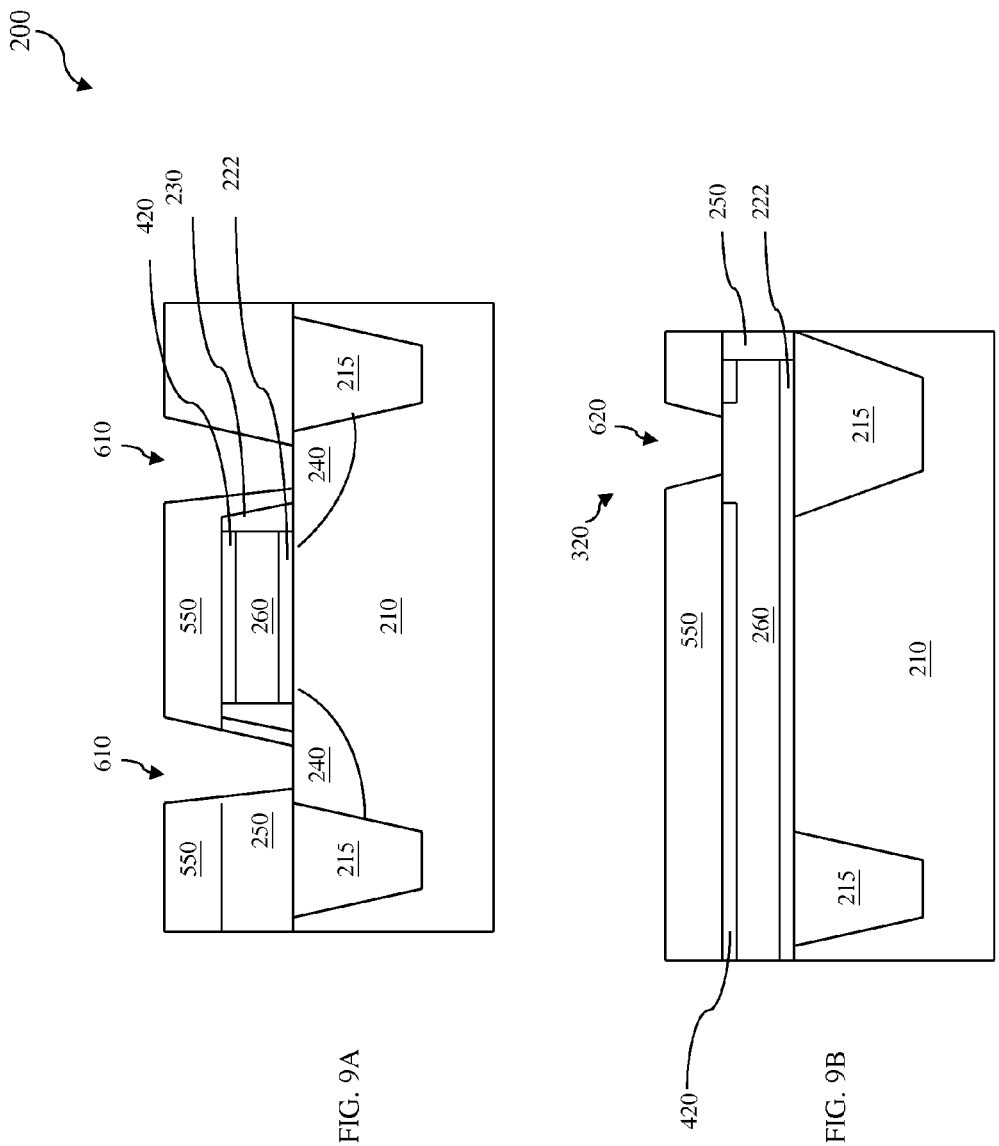

METHOD OF SEMICONDUCTOR INTEGRATED CIRCUIT FABRICATION

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, high-k (HK) dielectric material and metal gate (MG) are often considered to form a gate stack for a field-effect transistor (FET). Integration issues occur when forming various contacts of source/drain and of MG, especially when film types being etched in source/drain contacts are substantially different than ones in MG contacts. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3A is a top view of a semiconductor device according to various aspects of the present disclosure.

FIGS. 3B, 4A, 5A, 6A, 8A and 9A illustrate cross sectional views of a semiconductor device along a line A-A in FIG. 3A.

FIGS. 3C, 4B, 5B, 6B, 8B and 9B illustrate cross sectional views of a semiconductor device along a line B-B in FIG. 3A.

FIG. 7A is a top view of a semiconductor device according to various aspects of the present disclosure.

FIG. 7B illustrates a cross section view of a semiconductor device along a line C-C in FIG. 7A.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
FIG. 1 is a flowchart of an example method for fabricating a semiconductor integrated circuit (IC) constructed according to various aspects of the present disclosure.
Figure 2:
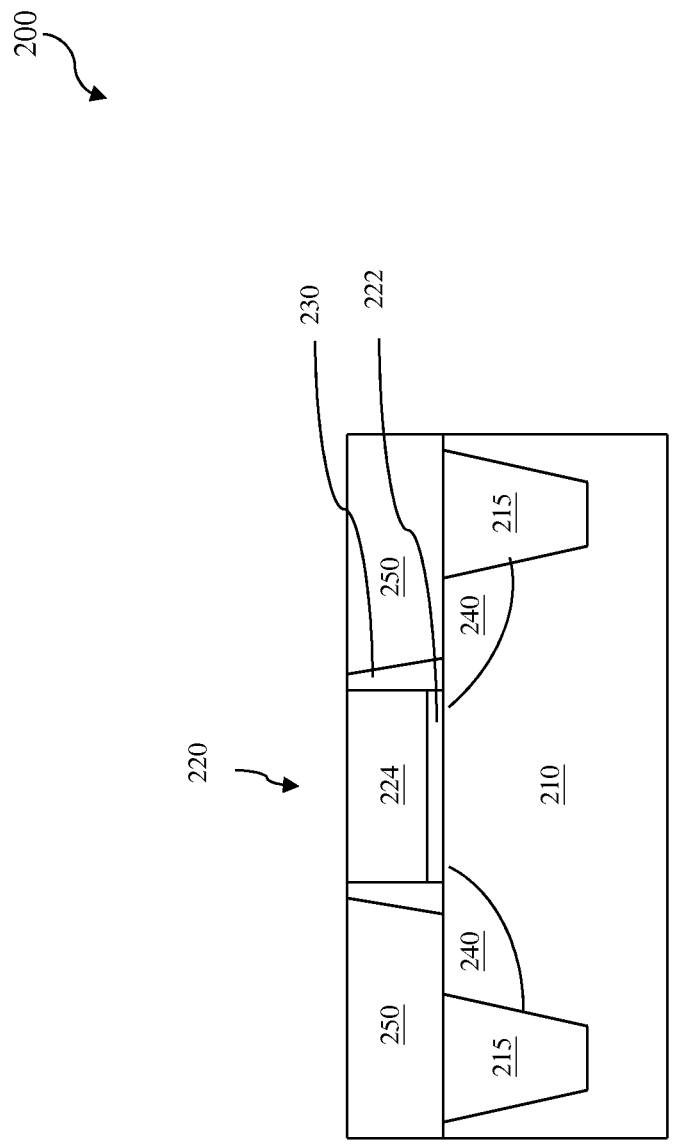
FIG. 2 is a cross-sectional view of an example semiconductor integrated circuit (IC) at fabrication stages constructed according to the method of FIG. 1.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 to 9B for the sake of example.

The method 100 begins at step 102 by receiving a semiconductor device 200. The semiconductor device 200 includes a semiconductor substrate 210. The semiconductor substrate 210 may include silicon, germanium, silicon germanium, gallium arsenide or other appropriate semiconductor materials. Alternatively, the semiconductor substrate 210 may include an epitaxial layer. For example, the semiconductor substrate 210 may have an epitaxial layer overlying a bulk semiconductor. Further, the semiconductor substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the semiconductor substrate 210 may include a semiconductor-on-insulator (SOI) structure such as a buried dielectric layer. Also alternatively, the semiconductor substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The semiconductor device 200 may also include various isolation features 215. The isolation features 215 separate various device regions in the semiconductor substrate 210. The isolation features 215 include different structures formed by using different processing technologies. For example, the isolation features 215 may include shallow trench isolation (STI) features. The formation of a STI may include etching a trench in the semiconductor substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 215.

The semiconductor device 200 may also include various doped regions (not shown) formed by implantation techniques. For example, a portion of the semiconductor substrate 210 is doped to form a P-type region and formed a P-well where a n-channel device will be fabricated. Similarly, another portion of the semiconductor substrate 210 is doped to form a N-type region and formed a N-well where a p-channel device will be fabricated. The doped regions are doped with P-type dopants, such as boron or BF2, and/or N-type dopants, such as phosphorus or arsenic. The doped regions may be formed directly on the semiconductor substrate 210, in a P-well structure, in an N-well structure, in a dual-well structure, or using a raised structure.

The semiconductor device 200 may also include a gate stack 220 formed on the semiconductor substrate 210 and separates source and drain. The gate stack 220 includes a dielectric layer 222 deposited on the semiconductor substrate 210. The dielectric layer 222 may include an interfacial layer (IL) deposited by any appropriate method, such as atomic layer deposition (ALD), chemical vapor deposition CVD and ozone oxidation. The IL includes oxide, HfSiO and oxynitride. It has been observed that an IL may provide a remedy for some HK dielectric gate stack integration issues, such as threshold voltage pinning and reducing carrier mobility. The IL may also be important as a diffusion barrier to prevent undesirable interface reactions between the HK dielectric material and the substrate.

The gate dielectric layer 222 may also include a high-k (HK) dielectric layer deposited on the IL by suitable techniques, such as ALD, CVD, metalorganic CVD (MOCVD), physical vapor deposition (PVD), thermal oxidation, combinations thereof, or other suitable techniques. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials. A post HK layer deposition annealing may be performed to enhance moisture control in gate dielectrics.

In the present embodiment, a replacement gate (RPG) process scheme is employed. Generally, in a RPG process scheme, a dummy gate is formed first and is replaced later by a MG after high thermal budget processes are performed. In the present disclosure, the gate stack 220 includes a dummy gate 224 formed on the gate dielectric layer 222 by deposition, lithography and etching processes known in the art.

The semiconductor device 200 also includes sidewall spacers 230 formed on the sidewalls of the gate stack 220. The sidewall spacers 230 may include a dielectric material such as silicon oxide. Alternatively, the sidewall spacers 230 may include silicon nitride, silicon carbide, silicon oxynitride, or combinations thereof. The sidewall spacers 230 may be formed by deposition and dry etching processes known in the art.

The semiconductor device 200 also includes source/drain (S/D) regions 240 in the semiconductor substrate 210. The S/D regions 240 are formed by a proper technique, such as one or more ion implantations. The S/D regions 240 may further include lightly doped (LDD) and heavily doped regions. After the formation of the source and drain (S/D) regions 240, one or more annealing processes may be performed. The annealing processes may include rapid thermal anneal (RTA), laser anneal, or other suitable annealing processes. As an example, a high-temperature thermal anneal step that may apply temperatures anywhere in the range of 900C-1100C, though other embodiments may use temperatures within a different range. As another example, high-temperature anneal includes a "spike" annealing process that has a very short time duration.

The semiconductor device 200 also includes a first interlayer dielectric (ILD) layer 250 on the semiconductor substrate 210. The first ILD layer 250 includes silicon oxide, oxynitride or other suitable materials. The first ILD layer 250 includes a single layer or multiple layers. The first ILD layer 250 is formed by a suitable technique, such as CVD, ALD and spin-on (SOG). The first ILD layer 250 fills in gaps between the gate stacks 220. A chemical mechanical polishing (CMP) process is performed to remove excess material in the first ILD layer 250. A depth of the CMP is controlled such that the dummy polysilicon gate 224 is exposed.

In the present embodiment, the dummy gate 224 is replaced by a metal gate (MG) 260 after high thermal budget processes are performed. The MG 260 may include a single layer or multi layers, such as metal layer, liner layer, wetting layer, and adhesion layer. The MG 260 may include Ti, Ag, Al, TiAlN, TaC, TaCN, TaSiN, Mn, Zr, TiN, TaN, Ru, Mo, Al, WN, Cu, W, or any suitable materials. The MG 260 may be formed by ALD, PVD, CVD, or other suitable process. A CMP may be performed to remove excessive MG 260 materials. The CMP process may have a high selectivity of metal layers selectivity with respect to the ILD layer 250. The CMP provides a substantially planar top surface for the metal gate 260 and the ILD layer 250.

Referring FIGS. 1 and 3A-3C, the method 100 proceeds to step 104 by forming a step-forming-hard-mask (SFHM) 310 on the MG stack in a predetermined area 320. FIG. 3A is a top view of a portion of the semiconductor device 200. Referring to FIG. 3A, cross section views of the semiconductor device 200 are taken along two lines, A-A and B-B. FIG. 3B is a cross section view along the line A-A (along the S/D region) of FIG. 3A. FIG. 3C is a cross section view along the line B-B (along the MG 260) of FIG. 3A and perpendicular to the direction of the line of A-A. In one embodiment, the predetermined area 320 includes an area where a future gate contact to be formed, as shown in FIG. 3A. The SFHM 310 serves as an etch mask in a subsequent etching, which will be described in details later. The SFHM 310 includes a photo-sensitive layer formed by a lithography process. In another embodiment, the SFHM 310 also includes silicon nitride, silicon oxynitride, silicon carbide and silicon-oxide-carbide, formed by a procedure including photolithography patterning and etching processes.

Figure 4A:
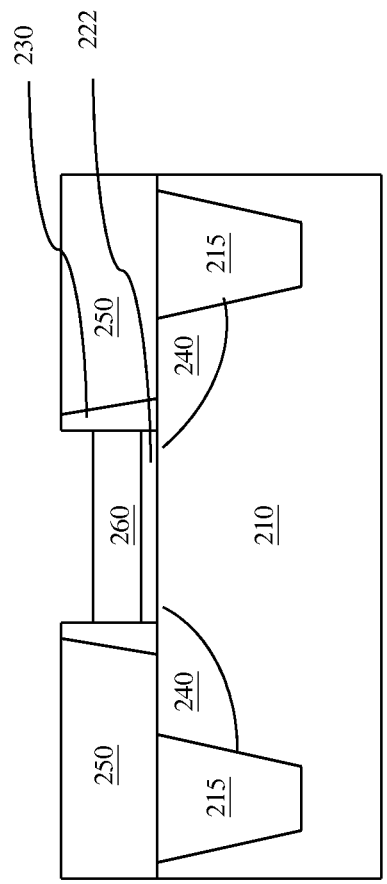
Figure 4B:
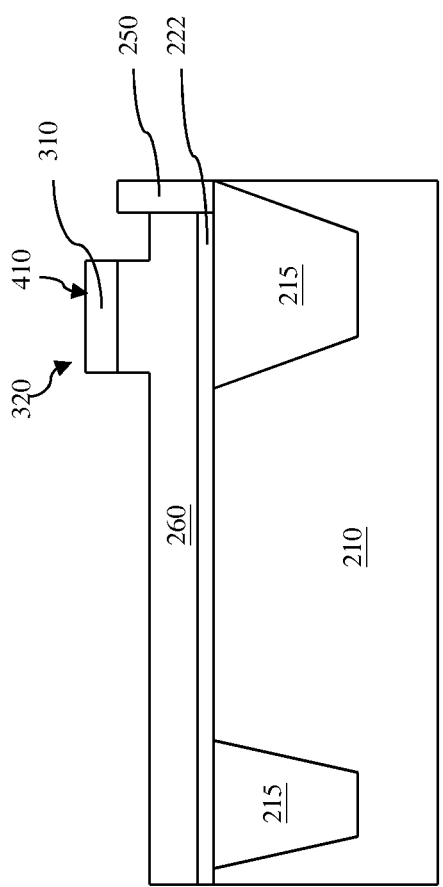

The method 100 proceeds to step 106 by forming a MG, as shown in FIGS. 4A and 4B. FIG. 4A is a cross section view along the line A-A of FIG. 3A and FIG. 4B is a cross section view along the line B-B of FIG. 3A. The MG recessing includes a dry etch, a wet etch, or a combination of dry etch and wet etch. The SFHM 310 serves as an etching mask to protect the underlying MG 260 during the recess and results in forming a MG step 410 in the predetermined area 320, thus referred the hard mask 310 to as the step-forming-hard mask (SFHM) 310. The MG 260 retains full thickness in the predetermined area 320 while the MG 260 has a partial thickness in a non-predetermined area.

Figure 5A:
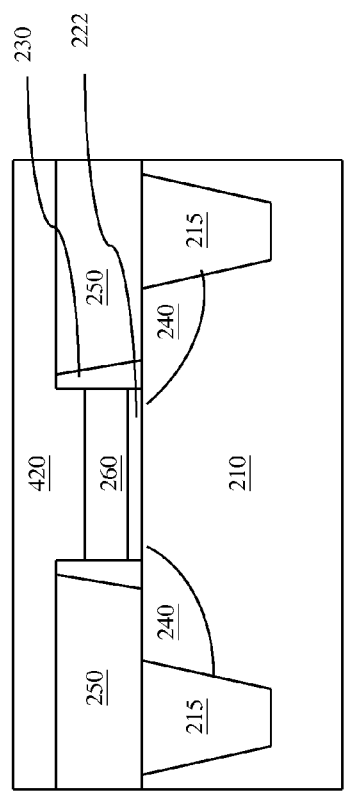
Figure 5B:
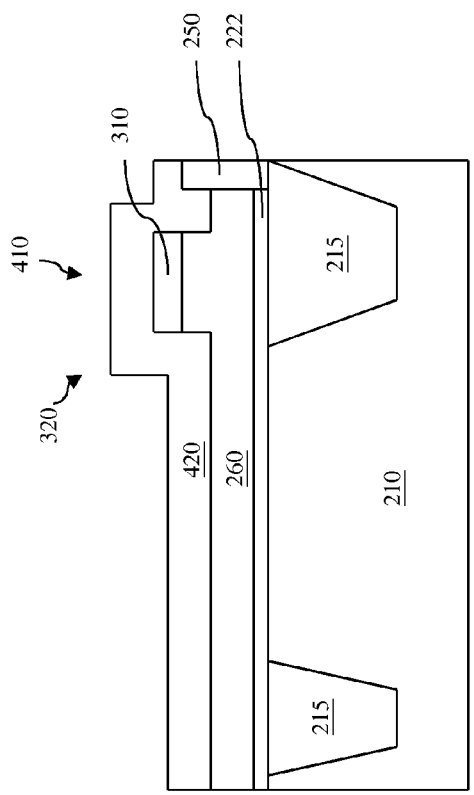

The method 100 proceeds to step 108 by depositing a MG hard mask 420 over the substrate 210, as shown in FIGS. 5A and 5B. FIG. 5A is a cross section view along the line A-A of FIG. 3A and FIG. 5B is a cross section view along the line B-B of FIG. 3A. The MG hard mask 420 includes silicon nitride, silicon oxynitride, silicon carbide and silicon-oxide-carbide and may be deposited by CVD.

Figure 6A:
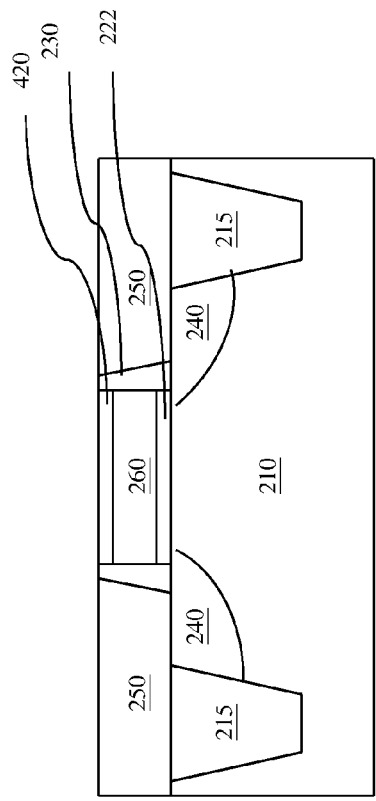
Figure 6B:
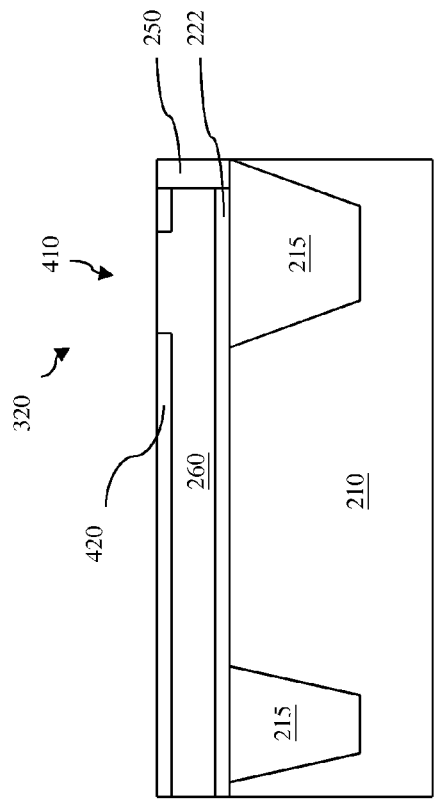

The method 100 proceeds to step 110 by recessing the MG hard mask 420. In one embodiment, a chemical mechanical polishing (CMP) is performed to polish back the MG hard mask 420 such that the MG hard mask 420 is fully removed from the MG step 410 in the predetermined area 320 while partially removed from the MG stack 220 in the non-predetermined area, as shown in FIGS. 6A and 6B. FIG. 6A is a cross section view along the line A-A of FIG. 3A and FIG. 6B is a cross section view along the line B-B of FIG. 3A. The MG hard mask recess also includes a dry etch, a wet etch, or a combination of dry etch and wet etch.

FIG. 7A is a top view of a portion of the semiconductor device 200. Referring to FIG. 7A, a cross section view of the semiconductor device 200 is taken along a line C-C. FIG. 7B is the cross section view along the line C-C. In one embodiment, two gate stacks 220 locate adjacent to each other. One of the two gate stacks 220 is included in the predetermined area 230, referred to as the gate stack 220A, and one is in the none-predetermined area, referred to as the gate stack 220B, as shown in FIG. 7B. After the MG hard mask recess, the gate stacks 220A and 220B are configured differently such that the gate stack 220A does not have the MG hard mask 420 as its top layer while the gate stack 220B does.

The method 100 proceeds to step 112 by depositing a second ILD layer 550 over the semiconductor substrate 210, as shown in FIGS. 8A and 8B. FIG. 8A is a cross section view along the line A-A of FIG. 3A. FIG. 8B is a cross section view along the line B-B of FIG. 3A. The second ILD layer 550 is similar in many respects to the first ILD 250.

The method 100 proceeds to step 114 by forming source/drain contacts 610 and gate contact 620, as shown in FIGS. 9A and 9B. FIG. 9A is a cross section view along the line A-A of FIG. 3A and FIG. 9B is a cross section view along the line B-B of FIG. 3A. The source/drain contact 610 and the gate contact 620 may be formed simultaneously by a procedure including photolithography patterning and contact etching processes. The contact etching includes a dry etch, a wet etch, or a combination of dry etch and wet etch. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. The etching may include a multiple-step etching to gain etch selectivity, flexibility and desired etch profile.

In present embodiment, after the MG hard mask 420 has been fully removed from the gate stack 220A, etched films in the contact etching are substantially similar to the first and the second ILD, in both of the source/drain contacts 610 and the gate contact 620.

The method 100 may further include forming a multilayer interconnection. The multilayer interconnection (not shown) may include vertical interconnects, such as conventional vias, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The present disclosure provides many different embodiments of fabricating a semiconductor IC that provide one or more improvements over the prior art. In one embodiment, a method for fabricating a semiconductor integrated circuit (IC) includes receiving a semiconductor device. The semiconductor device includes a semiconductor substrate, a metal gate (MG) stack on the semiconductor substrate, a source and a drain separated by the metal gate stack and a first interlayer dielectric (ILD) layer between the metal gate stacks on the semiconductor substrate. The method also includes forming a step-forming-hard-mask (SFHM) on the MG stack in a predetermined area on the semiconductor substrate, performing MG recessing, depositing a MG hard mask over the semiconductor substrate and recessing the MG hard mask to fully remove the MG hard mask from the MG stack in the predetermined area.

In another embodiment, a method for fabricating a semiconductor IC includes receiving a semiconductor device. The semiconductor device includes a source/drain and a metal gate (MG) on a semiconductor substrate. The method also includes forming a step-forming-hard-mask (SFHM) on the MG stack in a predetermined area, where a gate contact to be formed, recessing the MG with an etch selectivity respective to the SFHM, depositing a MG hard mask over the semiconductor substrate, recessing the MG hard mask, depositing an ILD layer over the substrate and forming contacts of source/drain and gate.

In yet another embodiment, a method for fabricating a semiconductor IC includes receiving a semiconductor device. The semiconductor device includes a semiconductor substrate, a metal gate stack on the semiconductor substrate, a source and a drain separated by the metal gate stack and a first interlayer dielectric (ILD) layer between the gate stacks on the semiconductor substrate. The method also includes forming a step-forming-hard-mask (SFHM) on the MG stack in a predetermined area in the semiconductor substrate, where a gate contact to be formed, performing metal gate (MG) recessing with SFHM protection of the MG stack in the predetermined area, wherein the MG stack in the predetermined area remains full thickness while the MG stack in the non-predetermined area having partial thickness of the MG stack, depositing a MG hard mask over the semiconductor substrate, recessing the MG hard mask by chemical mechanical polishing (CMP) to fully remove the MG hard mask from the MG stack in the predetermined area, depositing a second ILD layer over the substrate and forming contacts of source/drain and MG by etching ILD layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
   receiving a semiconductor device, the semiconductor device including:
      a semiconductor substrate;
      a metal gate (MG) stack on the semiconductor substrate;
      a source and a drain separated by the metal gate stack on the semiconductor substrate; and
      a first interlayer dielectric (ILD) layer on the semiconductor substrate;
   forming a step-forming-hard-mask (SFHM) on the MG stack in a predetermined area in the semiconductor substrate;
   performing MG recessing;
   depositing a MG hard mask over the semiconductor substrate; and
   recessing the MG hard mask to fully remove the MG hard mask from the MG stack in the predetermined area.

2. The method of claim 1, wherein the predetermined area includes an area where a gate contact is to be formed on the MG stack.

3. The method of claim 1, wherein the SFHM includes a photo-sensitive layer formed by a lithography process.

4. The method of claim 1, wherein the SFHM includes dielectric materials formed by a procedure of photolithography patterning and etching processes.

5. The method of claim 1, wherein the MG is recessed by an etching process having an etch selectivity respective to the SFHM.

6. The method of claim 5, wherein the MG stack in the predetermined area is protected by the SFHM during the MG recessing.

7. The method of claim 6, wherein the protected MG stack in the predetermined area is at a full thickness.

8. The method of claim 1, wherein the MG hard mask is recessed by chemical mechanical polishing (CMP).

9. The method of claim 8, wherein the CMP removes a portion of the MG hard mask from the MG stack outside of the predetermined area.

10. The method of claim 8, wherein the CMP fully removes the MG hard mask from the MG stack in the predetermined area.

11. The method of claim 1, further comprising:
depositing a second ILD layer over the substrate; and
forming contacts to the source/drain and MG stack.

12. The method of claim 11, wherein the second ILD layer has a same material as the first ILD layer.

13. The method of claim 12, wherein forming contacts etches the first and second ILD layers to form openings for the source/drain contact and the MG stack contact.

14. A method for fabricating a semiconductor integrated circuit (IC), the method comprising:
receiving a semiconductor device including a source/drain and a metal gate (MG) on a semiconductor;
forming a step-forming-hard-mask (SFHM) on the MG in a predetermined area where a gate contact is to be formed;
recessing the MG with an etch selectivity respective to the SFHM;
depositing a MG hard mask over the semiconductor substrate;
recessing the MG hard mask;
depositing an ILD layer over the substrate; and
forming contacts to the source/drain and metal gate.

15. The method of claim 14, wherein the SFHM includes a photo-sensitive layer formed by a lithography process.

16. The method of claim 14, wherein the SFHM includes dielectric materials formed by a procedure of photolithography patterning and etching processes.

17. The method of claim 14, wherein after recessing the MG, the MG in the predetermined area remains full thickness while the MG in non-predetermined area is a portion of full thickness.

18. The method of claim 14, wherein the MG hard mask is recessed by chemical mechanical polishing (CMP).

19. The method of claim 18, wherein the CMP fully removes the MG hard mask from over the MG in the predetermined area while partially removing the MG hard mask from over the MG in the non-predetermined area.

20. A method for fabricating a semiconductor integrated circuit (IC), the method comprising:
receiving a semiconductor device, the semiconductor device including:
a semiconductor substrate;
a metal gate stack on the semiconductor substrate;
a source and a drain separated by the metal gate (MG) stack on the semiconductor substrate, the MG stack having a first thickness; and
a first interlayer dielectric (ILD) layer on the semiconductor substrate;
forming a step-forming-hard-mask (SFHM) on the MG stack in a predetermined area in the semiconductor substrate, the predetermined area being where a contact to the MG stack is formed;
performing metal gate recessing, wherein the SFHM protects the MG stack in the predetermined area during the metal gate recessing, such that the MG stack in the predetermined area has the first thickness while the MG stack in the non-predetermined area has a second thickness less thank the first thickness after the metal gate recessing;
depositing a MG hard mask over the semiconductor substrate;
recessing the MG hard mask by chemical mechanical polishing (CMP) to fully remove the MG hard mask from the MG stack in the predetermined area;
depositing a second ILD layer over the substrate; and
forming contacts to the source/drain and the MG stack by etching the first and second ILD layers.

* * * * *